United States Patent [19]

Eberbach

[11] Patent Number: 4,769,848
[45] Date of Patent: Sep. 6, 1988

[54] ELECTROACOUSTIC NETWORK

[75] Inventor: Steven J. Eberbach, Ann Arbor, Mich.

[73] Assignee: Howard Krausse, Ann Arbor, Mich.

[21] Appl. No.: 562,724

[22] Filed: Dec. 16, 1983

Related U.S. Application Data

[63] Continuation-in-part of Ser. No. 146,254, May 5, 1980, Pat. No. 4,421,949.

[51] Int. Cl.$^4$ ............................................. H03G 5/00
[52] U.S. Cl. ........................................ 381/97; 381/98; 381/99
[58] Field of Search ............... 381/97, 98, 99, 100, 381/103; 179/115.5 DV

[56] References Cited

U.S. PATENT DOCUMENTS

| | | | |
|---|---|---|---|
| 2,259,907 | 10/1941 | Olney | 179/115.5 PS |
| 2,539,672 | 1/1951 | Olson et al. | 179/115.5 PS |
| 4,074,070 | 2/1978 | Gaus | 381/99 |
| 4,100,371 | 7/1978 | Bayliff | 381/97 |
| 4,198,540 | 4/1980 | Cizek | 381/99 |
| 4,220,832 | 9/1980 | Nagel | 179/115.5 PS |
| 4,237,340 | 12/1980 | Klipsch | 381/99 |
| 4,348,549 | 9/1982 | Berlant | 381/99 |
| 4,450,322 | 5/1984 | Wilson | 179/146 E |
| 4,528,691 | 7/1985 | Edwards | 381/97 |

FOREIGN PATENT DOCUMENTS

52-33517 3/1977 Japan ..................... 381/97

Primary Examiner—Forester W. Isen
Attorney, Agent, or Firm—James M. Deimen

[57] ABSTRACT

Disclosed is a passive delay network for insertion in the high frequency signal path of a crossover network in a high fidelity loudspeaker. The delay network provides means to adjust the optimum listening window electrically rather than by changes in the physical construction of the speaker cabinet. Electroacoustic high frequency and low frequency drivers may be mounted in a planar baffle or mounted co-axially. The delay network retains a "flat" amplitude-frequency characteristic and minimizes time dispersion in the acoustic signal received by the listener. Correction for time delay is most important near the transition frequency of the crossover network because near the transition frequency substantially equal sound energy is radiated by both the high frequency and low frequency drivers.

Also disclosed is a novel construction for a co-axial driver combination and a technique for adjusting both the delay in the electric delay line network and the air path delay of electroacoustic drivers. The co-axial drivers include sound absorbent means preventing direct sound radiation between the low and high frequency drivers. The adjustment technique comprises a method of experimentally testing and adjusting the mutual inductances in the electric delay line and the air path delay.

Applicant's method and apparatus empirically selects and adjusts the electroacoustic networks of the loudspeaker to effectively reduce or eliminate the cause of amplitude peaks, coloration and variation throughout substantially the entire "hemispherical" volume in front of co-axial loudspeakers. The method and apparatus is also effective with non-co-axial loudspeakers. The loudspeaker electroacoustic network components are physically, electrically and magnetically (inductively) adjusted for flattened acoustic phase response beyond the amplitude pass band roll-off of each filter, driver and delay network both on and off axis. Then the components are further adjusted as a combination to minimize the on and off axis amplitude peaking throughout the hemispherical listening volume in front of the loudspeaker. This approach to equalizing the loudspeaker permits the final adjustments to quickly converge on the values necessary for flat amplitude and phase response throughout substantially the entire volume in front of the loudspeaker. Applicant's empirical approach eliminates the need for sophisticated computer analysis of oversimplified loudspeaker simulations.

17 Claims, 5 Drawing Sheets

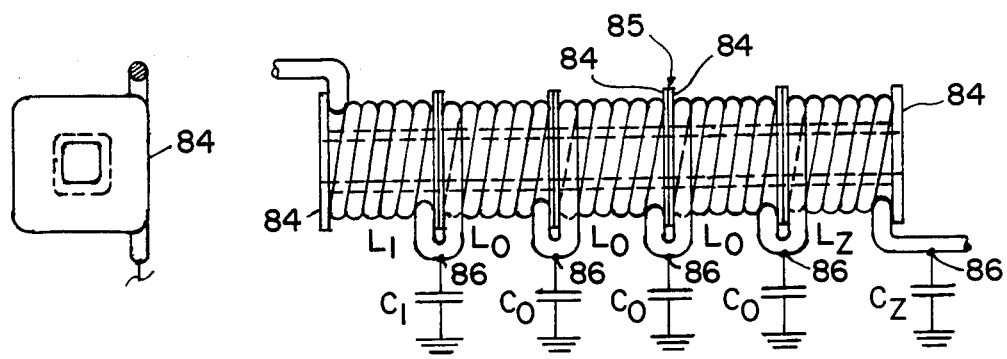
FIG. 12
FIG. 11
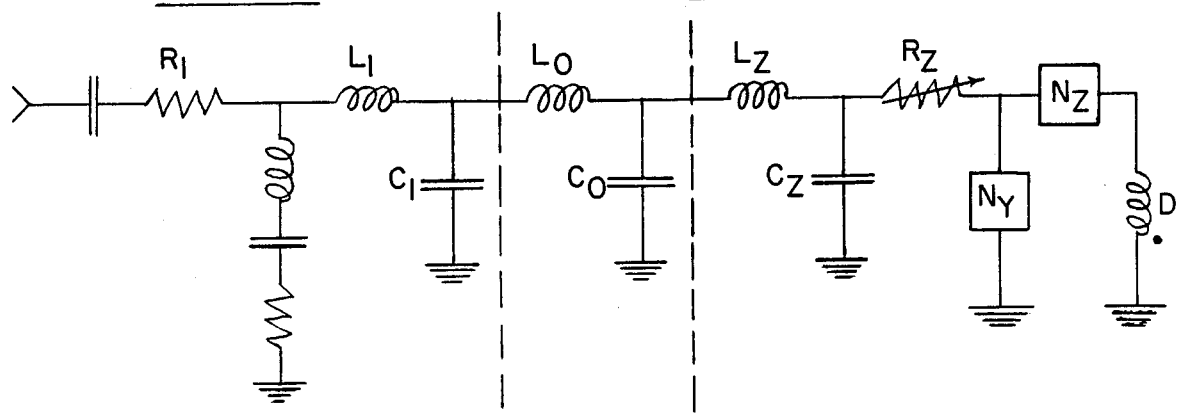
FIG. 13
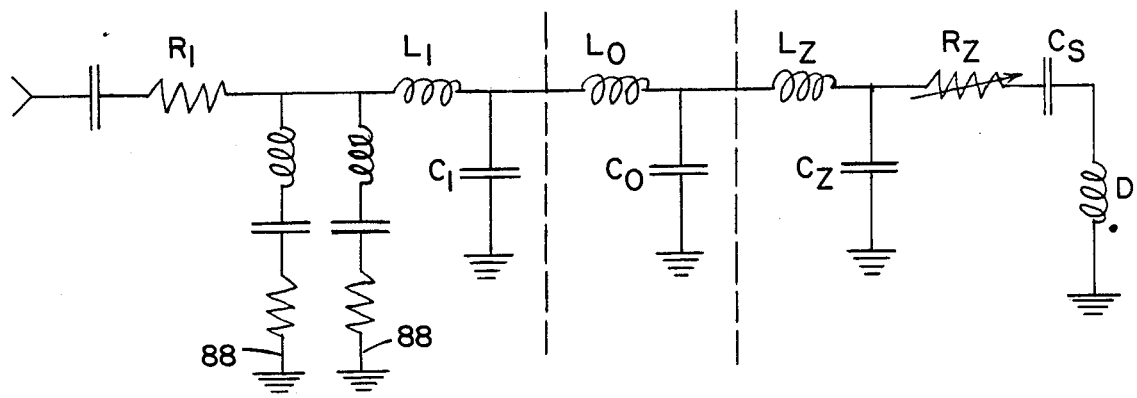
FIG. 14

ELECTROACOUSTIC NETWORK

This application is a continuation-in-part of application Ser. No. 146,254, filed May 5, 1980, now issued U.S. Pat. No. 4,421,949, dated Dec. 20, 1983.

BACKGROUND OF THE INVENTION

The field of the invention pertains to means for delaying acoustic signals generated by electroacoustic drivers or transducers in sound reproduction speakers. In particular, the invention pertains to means for assuring the simultaneous receipt of sounds by the listener generated by simultaneous electric signals input to the speaker.

Typically, the electroacoustic drivers are mounted in apertures in a baffle forming a portion of the speaker cabinet. Unfortunately, electric signals impressed upon two or more of the drivers simultaneously will not create a simultaneous acoustic signal at the position of the listener. In practice the low frequency filter and low frequency driver exhibit more delay than the high frequency filter and high frequency driver. Therefore, prior art efforts involve adding delay to the air path of the high frequency driver. Air path delay techniques are disclosed in U.S. Pat. Nos. 3,824,343 and 3,927,261 wherein a plurality of drivers are physically positioned to provide increased air paths in proportion to the rise times of the drivers. Similarly, U.S. Pat. No. 4,015,089 discloses a plurality of drivers arranged in staggered relation along their radiating axis at a predetermined spacing from each other. A second approach to delay, disclosed in the prior art, pertains to active electrical network means. U.S. Pat. No. 4,151,369 discloses a decoder, gain and delay system for multiple speakers in a "surround sound" configuration. The speakers are located circumferentially about the listener at various radii.

Another approach to active networks is disclosed in a series of articles by Siegfried Linkwitz entitled "Loudspeaker System Design" published in WIRELESS WORLD, May and Jun. 1978 issues. Linkwitz describes active crossover networks with active delay compensation. He comments that the design flexibility of active networks outweighs the cost saving of a passive network; however, no passive network is disclosed. He further emphasizes at the end of his series of articles that computer optimization would be required to design a passive network comparable to his active crossover networks.

Japanese Patent Publication No. 54-13321 discloses the combination of a "phase delay" circuit in the low frequency filter circuit with the high frequency driver positioned behind the low frequency driver. Since the addition of additional electric delay in the low frequency filter circuit further increases the time differential between the arrival of high frequency sound and low frequency sound at the listening point, the high frequency driver must be located further behind the low frequency driver than would otherwise be necessary. Such an electrical configuration does not lend itself to applications wherein both drivers are in the same baffle (i.e., not behind one another) or co-axial drivers wherein the high frequency driver is in front of the low frequency driver. Japanese Patent Publication No. 52-33517 discloses the application of a "phase delay" circuit in the high frequency filter circuit in addition to or in substitution for placing the high frequency driver behind the low frequency driver. The object of this disclosure as well as the other above Japanese disclosure is to flatten the phase response of the combined electroacoustic network at the location of the test microphone in front of the loudspeaker.

Merely flattening the phase response of a combination of drivers in addition to the amplitude response by geometrically moving the high frequency driver behind the low frequency driver or substituting a delay circuit for the geometric movement and adjustment of the relative polarities however is not sufficient to remove coloration and amplitude peaking over a large included volume in front of the loudspeaker.

In particular, neither Japanese disclosure is directed to co-axial drivers wherein the high frequency driver is in front of the low frequency driver. Nor is Publication No. 52-33517 directed to overcoming the phase response changes in the low frequency driver near the amplitude response band edge.

In a paper entitled "Is Phase Linearization of Loudspeaker Crossover Networks Possible By Time Offset and Equalization?", by John Vanderkooy and Stanley P. Lipshitz, presented at the 70th Convention of the Audio Engineering Society (1981, Preprint 1857 (C-6)), the authors emphasize that phase linearity and perfect impulse response are not possible without the use of complicated delay equalizers (page 2). The paper emphasizes that adding delay to any of a variety of conventional filter-driver networks cannot achieve phase linearization.

SUMMARY OF THE INVENTION

The invention comprises a passive electric delay network inserted in the high frequency filter of a crossover network in a high fidelity loudspeaker. In combination with the crossover network, the electroacoustic drivers and the position of the listener, the delay network is directed toward retaining a flat amplitude-frequency response and an equalization of all delay in the electroacoustic signal from the input to the loudspeaker to the listener's ears. The accomplishment of equalization of delay results in a minimization of time dispersion considered by many to be a desirable goal.

It is an object of this invention to provide means to adjust the listening angle or expand the listening window with passive electric delay in the driver networks.

A second object is to provide means to adjust and expand the listening window with the combination of passive electric delay in the driver network and means to vary the air paths to the listener.

A third object is to provide passive frequency-dependent electric delay equalization or correction means for minimizing frequency dependent delay errors in the entire hemispherical volume in front of co-axially mounted high frequency and low frequency drivers.

A fourth object is to provide a particularly convenient method for testing and adjusting an electroacoustic network.

A further object is to provide convenient means to adjust the passive delay network for elimination of the amplitude response ripple in the pass band caused by mismatch of the high pass filter, delay network and high frequency driver.

The invention provides relatively inexpensive means to add delay and adjust the delay by selecting and adjusting the passive elements of the delay circuit. The configuration disclosed does not require the use of sophisticated computer routines to obtain superior results.

The correction for delay is most important near the transition frequency of the crossover because substantially equal sound energy is radiated by both the high frequency and low frequency drivers near the transition frequency.

Using the method and apparatus disclosed below applicant empirically selects and adjusts the drivers, filters, delay network values and mutual inductive couplings to flatten the acoustic phase responses of each driver both within and substantially beyond the acoustic amplitude roll-off of the driver and filter pass bands. Once the separate driver, filter and delay electroacoustic networks are properly adjusted, then the network components are further adjusted in combination to obtain acoustic flat amplitude and phase response throughout a large volume of space in front of the loudspeaker, i.e., the flat acoustic amplitude and phase response is optimized over substantially all angles in front of the loudspeaker.

When first applied by applicant to co-axial drivers, the method of adjusting the electroacoustic networks disclosed below resulted in substantially better sound quality than expected. With further experience in applying the method to co-axial drivers, a much closer approach to perfect impulse response throughout substantially the entire "hemispherical" volume in front of the loudspeaker than expected resulted.

Importantly, the complicated delay equalizers believed required by Vanderkooy and Lipshitz above and others are not needed. Phase linearity and substantially perfect impulse response throughout a listening volume can be achieved to the desired accuracy with applicant's relatively simple filter, delay and driver circuits as adjusted by applicant's method. The final adjustment including adjustment axially of the high frequency driver in front of the low frequency driver and of the network inductive couplings, flattens the acoustic phase response throughout the listening volume. Off axis peaks in amplitude response resulting in disturbing sound colorations are thereby reduced to the desired minimum.

DESCRIPTION OF THE DRAWINGS

FIG. 8a is a detailed schematic side view of a suitable construction for the co-axial drivers of FIGS. 6 and 7;

FIG. 8b is a detailed front view of the drivers shown in FIG. 8a;

FIG. 8c is a detailed schematic side view of an alternate suitable construction for the co-axial drivers of FIGS. 6 and 7;

FIG. 8d is a detailed front view of the drivers shown in FIG. 8c;

FIG. 11 is a schematic of the delay line inductances positioned for mutual inductance;

FIG. 12 is an end view of the delay line inductances as shown in FIG. 11;

FIG. 13 is an electrical schematic of a modified form of the network of FIG. 10;

FIG. 14 is an electrical schematic of a second modified form of the network of FIG. 10;

DESCRIPTION OF THE PREFERRED EMBODIMENTS

Figure 1:
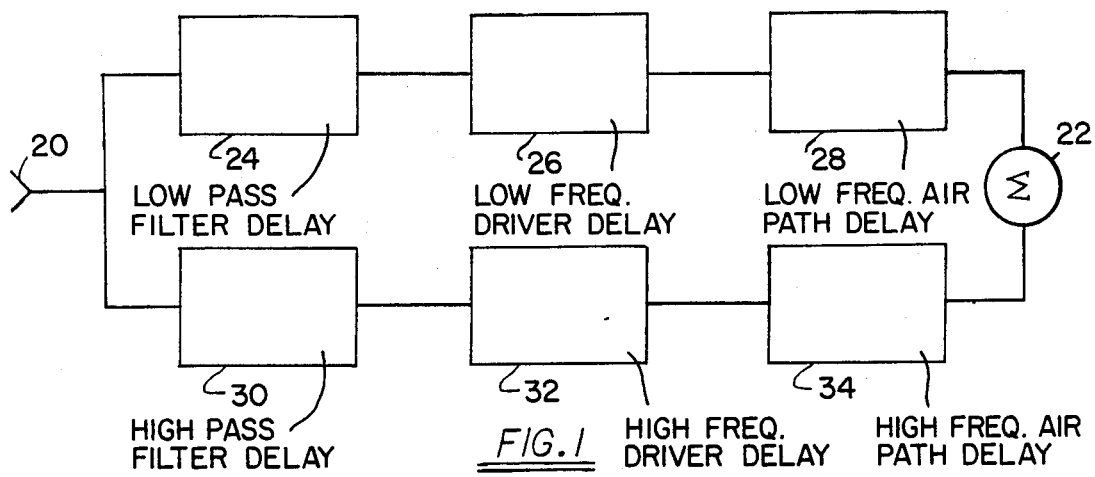
FIG. 1 is a block diagram of the electroacoustic sound path.

FIG. 1 discloses schematically the electroacoustic sound path from the electrical input to a loudspeaker at 20 to the ear of the listener at 22. Each box represents path delay as follows:

Box 24, the delay in the electric low pass filter;

Box 26, the delay in the low frequency electroacoustic driver;

Box 28, the delay in the low frequency air path to the listener;

Box 30, the delay in the electric high pass filter;

Box 32, the delay in the high frequency electroacoustic driver; and,

Box 34, the delay in the high frequency air path to the listener.

For accurate sound reproduction at the ear of the listener each branch of the above electroacoustic sound path should exhibit equal delay to the point of summation at the ear of the listener 22. This is most important near the transition frequency between both branches where substantially equal sound energy is radiated by both drivers. Of secondary importance, the electroacoustic sound path should exhibit equal delay at all or most frequencies in the pass bands of each branch.

It is commonly accepted that to minimize coloration of the sound, a reasonably flat amplitude-frequency response be maintained in the pass bands and through the transition frequencies. Thus, the electrical and mechanical elements of the electroacoustic sound path are constrained to provide a flat amplitude-frequency characteristic and equal delay in sound energy from input 20 to ear 22.

Figure 2:
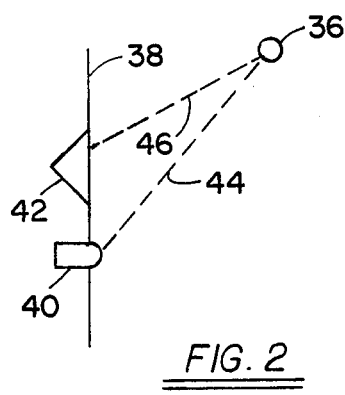
FIG. 2 is a schematic of a geometric listening arrangement for balancing delay.
Figure 3:
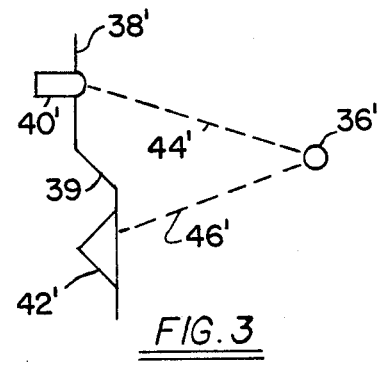
FIG. 3 is a schematic of a speaker construction arrangement for balancing delay.
Figure 4:
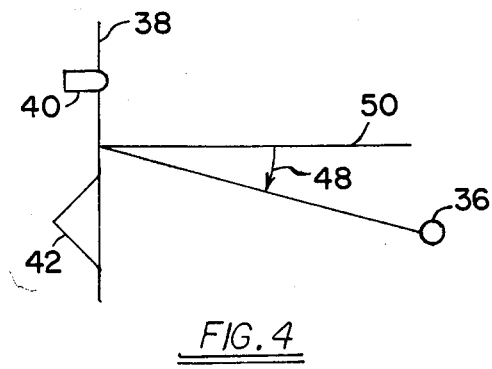
FIG. 4 is a schematic of the optimum listening angle for side by side high frequency and low frequency drivers.
Figure 5:
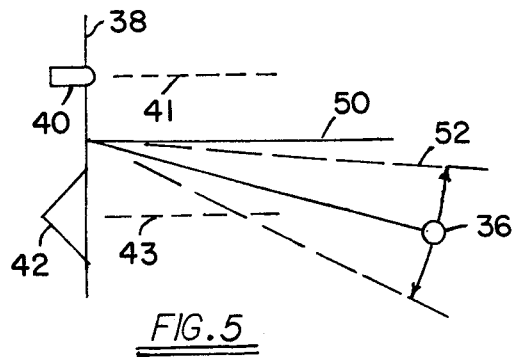
FIG. 5 is a schematic of the optimum listening window for side by side high frequency and low frequency drivers.

In practice the low frequency electroacoustic sound path naturally exhibits the most delay, therefore previous efforts have been directed to adding delay to the high frequency sound path, in particular, to the air path 34 between the high frequency driver 32 and the ear 22. FIGS. 2 and 3 schematically show two such approaches. In FIG. 2 a good delay match can be achieved by placing the listener 36 at an appropriate distance and angle relative to the baffle plane 38 of both high frequency 40 and low frequency 42 drivers so that the high frequency air path 44 exceeds the low frequency air path 46 by an amount just sufficient to provide total equal delay to the listener 36. In FIG. 3 the listener 36 is placed directly in front of and between the high frequency 40' and low frequency 42' drivers. The baffle plane 38', however, contains a discontinuity 39 to position the high frequency driver 40' behind the low frequency driver 42' a distance just sufficient to provide total equal delay to the listener 36'. The high frequency air path 44' is again longer than the low frequency air path 46'. Both approaches unfortunately limit severely the position of the listener or substantially add to the cost of the loudspeaker. As shown in FIG. 4 the optimum listening angle where the electroacoustic sound path is best equalized may be defined as the angle 48 from a perpendicular 50 to the baffle 38 and between the drivers. A deviation about the optimum listening angle 48 where the amplitude-frequency response remains acceptable comprises the listening window 52 as shown in FIG. 5. The optimum listening angle decreases with decreased relative delay between the high frequency path and the low frequency path. The listening window is widest when the spacing between the drivers relative to the wavelength of sound being simultaneously emitted by both drivers is least. The distance of the listener 36 from the baffle 38 for optimum equalization will also depend upon the specific relative delay between the low and high frequency paths. Although shown schematically in FIG. 5 in the plane containing the perpendicular axes 41 and 43 to the high frequency and low frequency drivers 40 and 42 respectively, the window 52 in three dimensions is a fan shaped volume of space.

In designing a loudspeaker a proper compromise among the various elements comprising the loudspeaker will ensure that under normal circumstances the listener will be positioned at the optimum listening angle. With small drivers exhibiting little delay and filters exhibiting little delay, this may be accomplished easily by mounting the drivers close together. However, if the low frequency path exhibits substantial delay relative to the high frequency path, or if substantial spacing between the drivers is required, suitable physical arrangement between the drivers to provide an adequate listening window becomes impractical. The optimum listening angle should be minimized because the optimum radiation angle of individual drivers is usually perpendicular to the baffle.

Figure 6:
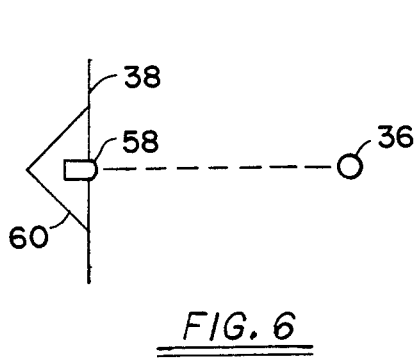
FIG. 6 is a schematic of the optimum listening point for a high frequency driver co-axial with the low frequency driver.
Figure 7:
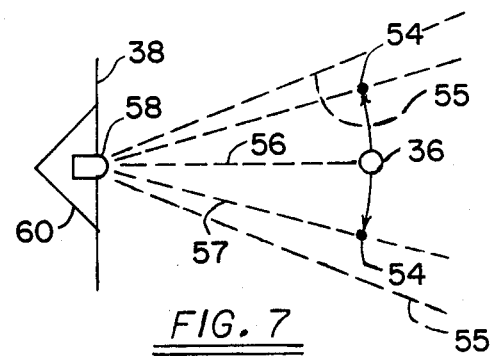
FIG. 7 is a schematic of the optimum listening window for a high frequency driver co-axial with the low frequency driver.

One approach to providing an optimum listening window is co-axial drivers shown schematically in FIGS. 6 and 7 and in more detail in FIGS. 8a, 8b, 8c and 8d. FIG. 9 schematically discloses the electric and electroacoustic elements for the co-axial drivers including delay correction added to the high frequency path. As shown in FIGS. 6 and 7 with sufficient delay the optimum listening angle can be decreased to substantially zero and the listener 36 is located directly in front of the co-axial drivers. The proper adjustment of delay correction to the high frequency electrical path broadens the listening angle to a cone 57. The acceptable listening window becomes a conical volume 55 about the cone 57 (in three dimensions). The driver axis 56 coincides with the cone axis.

Careful research by the applicant has shown that by optimizing the co-axial spacing between the high frequency driver 58 and the low frequency driver 60, the delay variations can be minimized over a large included volume, i.e., the conical volume enclosed by the cone 57 can be broadened and lengthened to provide optimum listening throughout a significant portion of the volume of the cone 55 shown in FIG. 7. Best results are obtained with low frequency drivers of relatively rapid rise time in acoustical output when driven by an electrical impulse function.

Figures 8A, 8B, 8C, 8D:
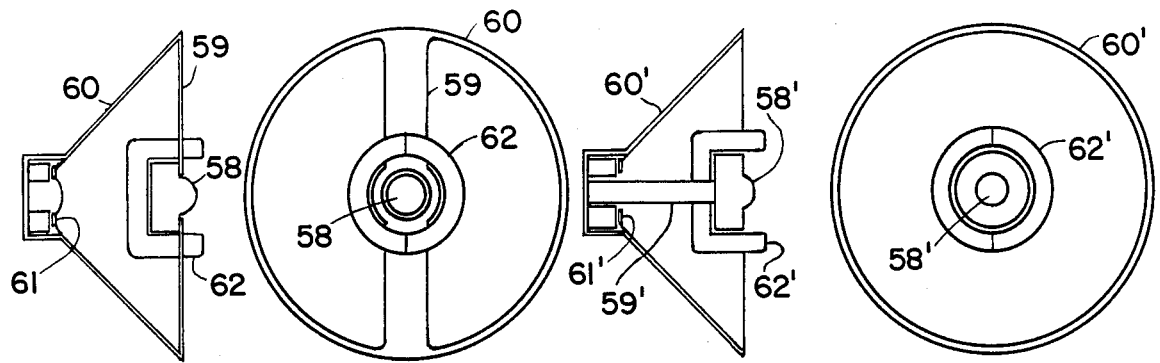
Figure 9:
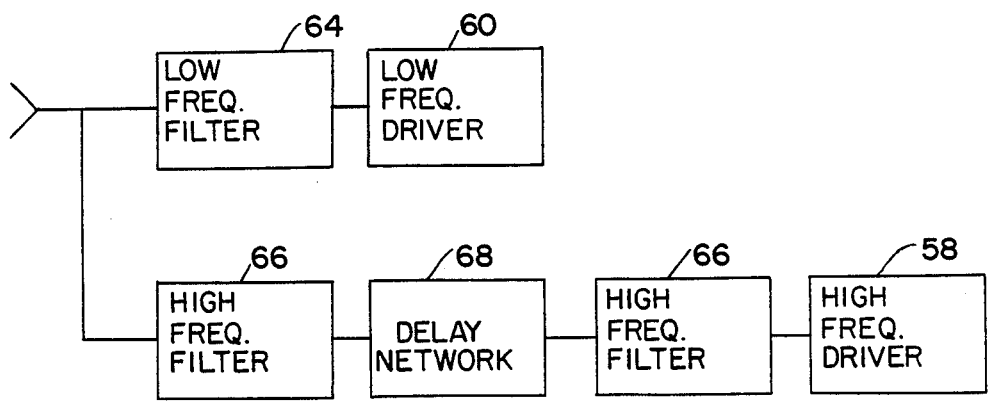
FIG. 9 is a block diagram of a suitable electric network for the co-axial drivers of FIGS. 7 and 8a through 8d.

As shown in FIGS. 8a and 8b the co-axial drivers comprise a low frequency driver 60 with voice coil 61 and a high frequency driver 58 mounted in a spider 59 in turn fastened to the low frequency driver frame. The back and sides of the high frequency driver 58 are surrounded by a split piece of sound absorbent material 62 to prevent direct high frequency sound from reaching the space between the high frequency driver and the low frequency driver and to damp reflections of sound between the rear of the high frequency driver and the low frequency driver cone. The split pieces of sound absorbent material are bonded together about the high frequency driver during assembly.

FIGS. 8c and 8d disclose an alternate means of supporting the high frequency driver 58' within the low frequency driver 60'. An axial support post 59' passes through the center of the voice coil 61' of the low frequency driver 60' and is fastened to the frame of the low frequency driver at one end and the base of the high frequency driver at the other end. As above, the sound absorbent material 62' is formed in two opposed pieces that are bonded or otherwise fastened together about the high frequency driver 58' during assembly.

The schematic in FIG. 9 for the co-axial drivers comprises a low frequency filter 64 which may be of conventional design and a high frequency filter 66 divided by a delay network 68 inserted therein. The schematic is, however, not limited to co-axial drivers. In accordance with the electric networks disclosed below, the combination allows optimization of flatness in amplitude-frequency response in a broad listening window and a matching of flat response in direct sound versus the flat response of the integrated sound field radiated in all directions simultaneously. Here, direct sound refers to sound reaching the listener's ear directly from a driver and integrated sound field refers to sound reaching the listener's ear after reflection in various ways from room boundaries and objects in the listening environment.

The filter and delay networks disclosed below comprise basically high pass filters whose characteristic impedance elements serve to compensate the amplitude-frequency characteristic as a whole as well as provide termination of the delay network which minimizes coloration ripple (periodic variations as a function of frequency) in the pass band of the networks.

In practice even a small impedance mismatch between the high frequency driver and the delay network causes coloration of the sound. The filter and delay networks include adjustment means to minimize coloration due to ripple in the pass band of the filter network.

Figure 10:
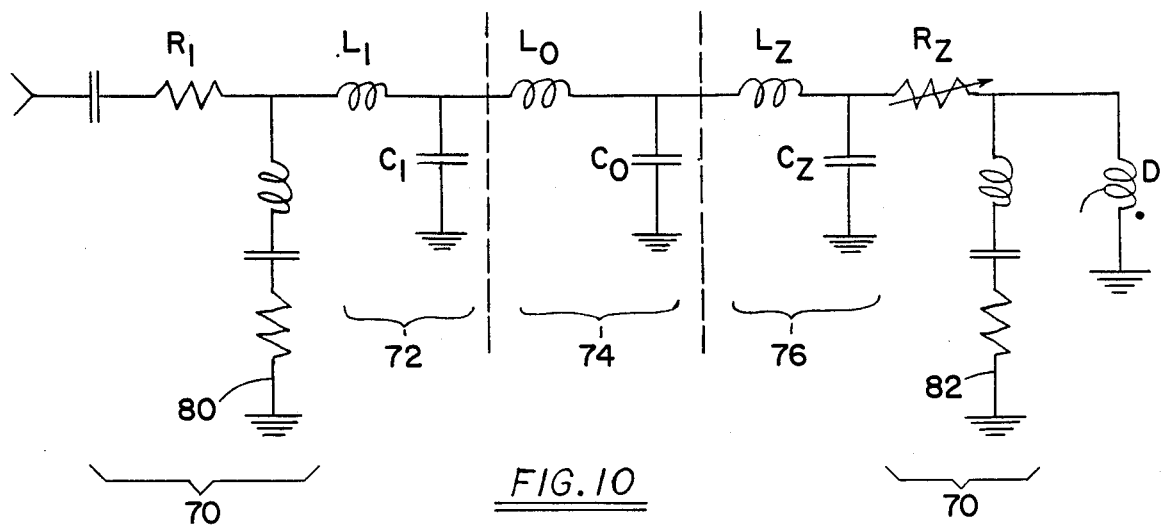
FIG. 10 is an electrical schematic of a high frequency delay line and filter network.

FIG. 10 discloses such a high frequency filter, delay and driver network suitable for the lower branch of the schematic in FIG. 9. The filter generally denoted by 70 is split by a delay network having an input stage ($L_1$, $C_1$) generally denoted by 72, one or more intermediate stages ($L_0$, $C_0$) generally denoted by 74 and an output stage ($L_Z$, $C_Z$) generally denoted by 76. One or more high frequency drivers 78 are connected to the network as shown. The high pass filter includes one or more impedance adjusting shunts 80, 82 along with a series driving resistance $R_1$ and an adjustable output series resistance $R_Z$. The overall impedance of the network may be characterized by an overall impedance of 8 ohms which is typical for many loudspeakers. Multiple impedance adjusting shunts 80 are disclosed in applicant's copending U.S. patent application Ser. No. 22,601, now U.S. Pat. No. 4,315,102.

The coloration ripple is a result of reflection of electric energy from each end of the filter network or delay network therebetween if the impedance at both ends is mismatched to the characteristic impedance of the delay network. If the mismatch of impedance is restricted to less than 10% at either end, most of the spurious (reflected) electric energy will be removed and the coloration substantially eliminated.

Testing has shown that the preferred relationships among some of the network elements are as follows:

$L_1$ equal to $L_0/2$; varying $L_1$ adjusts electroacoustic output at the higher end of the frequency range of the pass band;

$C_Z$ typically ranges between $C_0$ and $C_0/2$; varying $C_Z$ adjusts for minimum ripple in the pass band when $R_1$ is very small or zero;

$R_1$ determines the high frequency driver level; typically the driver is chosen with sufficient efficiency to permit an $R_1$ of a range from $\frac{1}{2}$ to 1 times the driver resistance. A relatively large $R_1$ permits lower tolerances in the components of the delay network.

The adjustment of the delay network and filter is best accomplished by winding the inductances $L_1$, $L_0$, $L_Z$ on spools 84 and fastening the spools together in a column as shown in FIGS. 11 and 12. Taps 86 for capacitances $C_1$, $C_0$, $C_Z$ extend as shown from the wire connections joining the inductances together electrically. Although only one winding is shown for each inductance, any number of windings as necessary to provide the required inductance for each spool can be wound on the spool. A pie winding for each inductance can also be utilized as an alternative. Shims are inserted between the spools at 85 as necessary before they are permanently fastened together. The distance between the spools determines the mutual inductance of the column and is determined as a part of the testing procedure described below.

More specifically, by varying the coupling (mutual inductances) of the inductances by varying the distance between the adjacent spools in close proximity, the time dispersion of the delay network is adjusted to accommodate drivers of differing characteristics. The acoustic dispersion characteristic of the complete network and driver is experimentally optimized by varying the coupling and observing the "flatness" of the acoustic phase and amplitude response curves as derived from a Fourier analysis of the transfer function between the electric input signal and the acoustic output sensed by a calibrated precision microphone. An impulse input signal is suitable for this purpose. Other signals including music can also be used.

Figure 18:
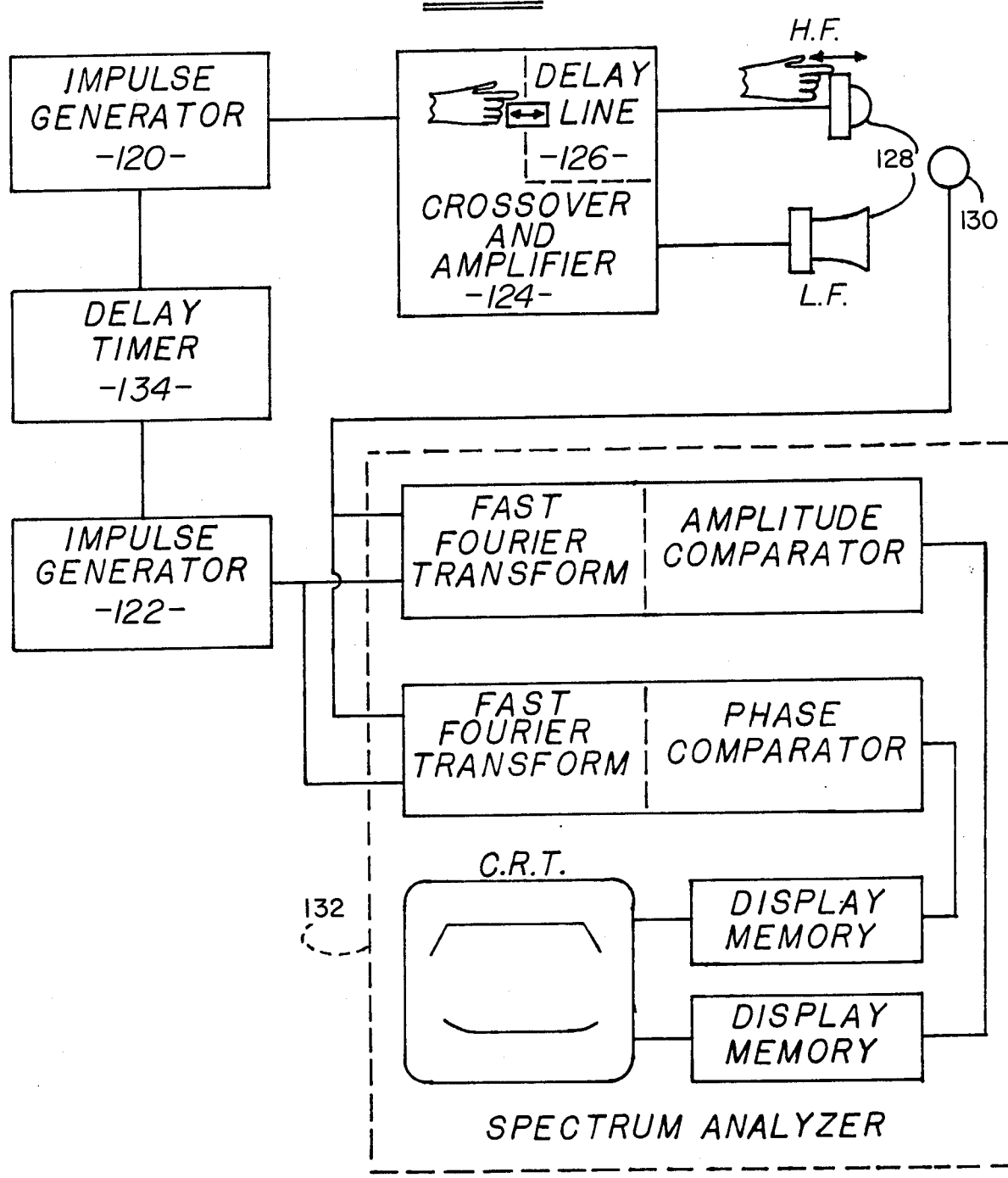
FIG. 18 is a block diagram illustrating the apparatus and connection therebetween to perform the method of adjusting the electroacoustic networks.

The Fourier analysis is performed by a Hewlett-Packard Model 3582A Spectrum Analyzer. Referring to FIG. 18 two pulse generators 120 and 122 producing identical impulse signals are utilized to provide one impulse to the complete electroacoustic path from amplifier, through crossover 124, delay line 126, drivers 128, air path to the microphone 130 and to Channel B of the Spectrum Analyzer 132 and a second impulse reference signal to Channel A of the Spectrum Analyzer. The second impulse signal is triggered by a timer 134 in turn triggered by the first impulse signal. The Spectrum Analyzer is a product of Hewlett-Packard Corporation, 1501 Page Mill Road, Palo Alto, Calif., 94304.

The timer delay applied to the reference impulse signal approximates the total delay in the electroacoustic path of the first impulse signal. The delay is determined as follows. A given frequency band such as 400 to 2000 Hz is selected and the timer delay is set to provide an average level phase shift on the phase-frequency curve displayed by the Spectrum Analyzer. The steepness of the slope in other bands on the phase curve represents the extent of time dispersion versus frequency in theother bands. Thus, by carefully adjusting the mutual coupling of the delay line inductances and the delay in a number of stages in the network, the time dispersion can be mimimized in the bands as desired. A variety of other parameters can also be adjusted for the best compromise obtainable.

A particularly advantageous method of roughly approximating the best acoustic phase and amplitude response comprises applying an electric impulse signal to the signal path of the electroacoustic network, sensing the acoustic output with a microphone and viewing the output on an oscilloscope. Various elements of the network may be then adjusted to cause the output signal to approach an impulse function. This method is useful where a spectrum analyzer is not available. More importantly, this method can be used as a preliminary coarse adjustment step before the method utilizing the spectrum analyzer described above is applied. The combination of both methods provides an efficacious procedure for adjusting and testing a loudspeaker. Changes in loudspeaker circuitry and configuration can be quickly tested for effect in a development program.

As an example, the axial distance between the low frequency and high frequency drivers in a co-axial speaker can be selected for the best overall output and least time dispersion over the entire frequency range of the loudspeaker. A relatively large axial distance requires more intermediate stages ($L_0$, $C_0$) in the delay line and in the delay line and results in a narrower listening window. Conversely, relatively small axial distance is limited by the physical size of the high frequency driver and surrounding sound absorbent materials as shown in FIGS. 8*a* and 8*c*. There is an optimum distance where the overshoot or ringing of the acoustical reproduction of an impulse by the low frequency driver is minimized; however, this may not be the axial distance for best overall time dispersion characteristics. Adjusting this axial distance effectively adjusts the air path to the listener and the size of the listening window. With the co-axial drivers shown in FIG. 8 the spider 59 may be formed to hold the high frequency driver more inwardly or outwardly than shown in FIG. 8*a* and the post 59' shortened or lengthened from that shown in FIG. 8*c*.

The particular sound absorbent material surrounding the high frequency driver is important to minimizing the ringing of the low frequency driver output caused by multiple acoustical reflections. A particularly effective sound absorbent material is sold under the trademark THINSULATE by the 3M Corporation of Minneapolis, Minn. THINSULATE is a microfiber insulation material containing polyolefin fibers. Wool felt has been satisfactorily used also.

FIGS. 13 and 14 disclose modifications of the network of FIG. 10. In FIG. 13 the additional series and parallel networks or elements generally denoted by $N_Z$ and $N_Y$ are included to illustrate that other networks may be added at these locations to compensate for driver characteristics. In FIG. 14 such an element, capacitor $C_S$, is added to minimize ripples in the pass band and compensate for the inductive portion of the driver impedance. In this alternative the multiple adjusting shunts 88 in the filter network are located prior to the delay network.

Figure 15:
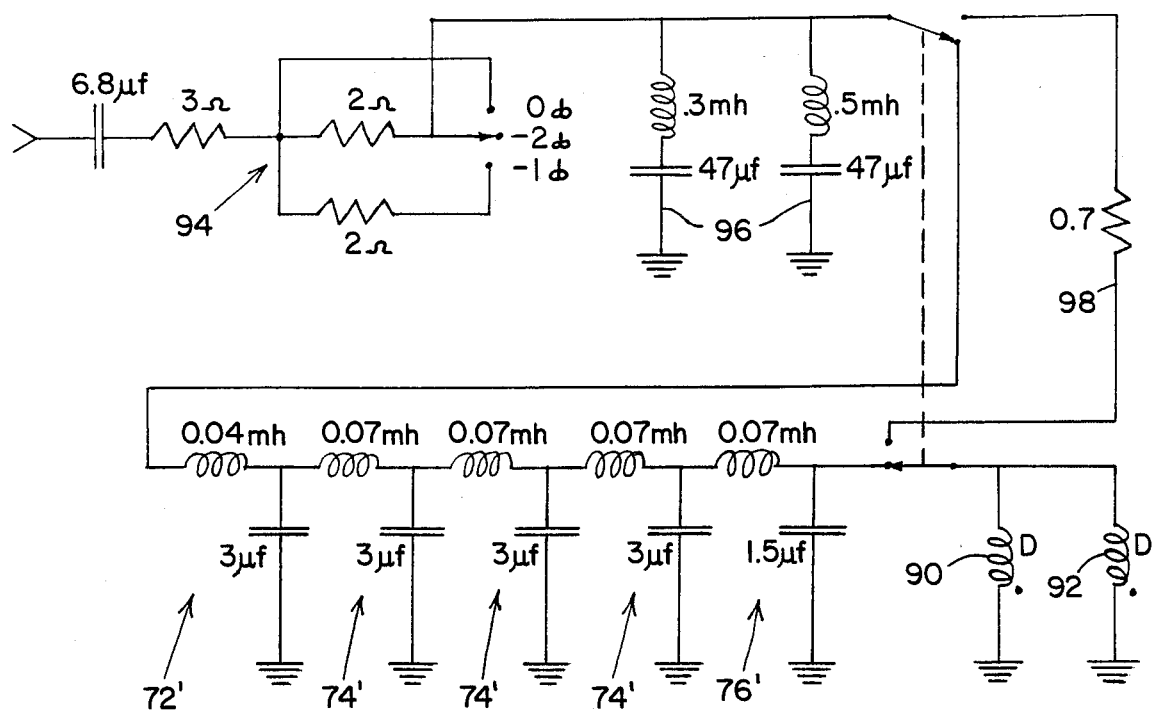
FIG. 15 is an electrical schematic of a complete high frequency filter and delay network for installation in a loudspeaker.

FIG. 15 illustrates a complete high frequency network for twin high frequency drivers 90 and 92 used with non-co-axial low frequency drivers (not shown). The filter portion of the network includes stepwise adjustment of the series driving resistance generally denoted by 94 and dual impedance adjusting shunts 96 as disclosed in applicant's above noted copending patent application. The inductance coupled rings of the copending appliation may be included in the shunts 96 as desired but are not shown here for simplicity. The delay portion includes a bypass 98, input stage 72', intermediate stages 74' and output stage 76'. The high frequency drivers are AD 0140 drivers available from Amperex Electronic Corporation, a division of North American Phillips, 230 Duffy Avenue, Hicksville, N.Y., 11802. The Ad 0140 driver frame is physically adjusted in size to improve the time delay versus angle acoustic amplitude and phase response of the low frequency driver.

The bypass 98 permits the delay portion of the network to be deleted or included at will. Thus, the listening angle and the listening window of the speaker can be changed as desired to suit the ear of the listener. The resistance inserted in the bypass is substantially equal to the resistive component of the delay network.

Figure 16:
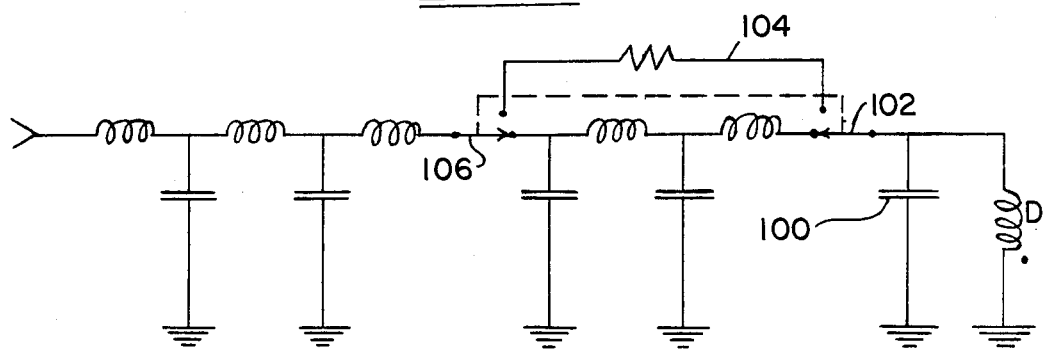
FIG. 16 is an electrical schematic of a driver and delay network including switching means therein.

As an alternative, a portion of the delay network can be bypassed or inserted as shown in FIG. 16. Typically, the final delay stage capacitor 100 is one-half or otherwise unequal to the other delay stage capacitors and therefore is located between the final bypass switch 102 and the driver. The bypass 104 includes a resistance substantially equal to the resistive component of the delay stages bypassed. As shown, two delay stages are bypassed between switches 106 and 102; however, gang switching can be utilized to individually insert or bypass individual delay stages.

Figure 17:
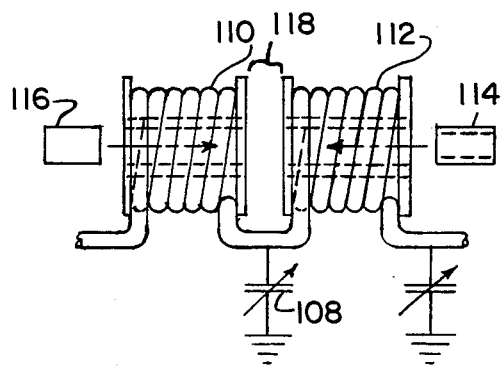
FIG. 17 is a schematic of alternate means of adjusting delay network stages.

FIG. 17 is included to illustrate various means to adjust the impedance of delay stages and delay networks. In the design and testing stage of the development of the delay network, the impedance of individual delay stages can be adjusted by changes in the capacitance as shown by variable capacitor 108 or changes in the inductors 110 or 112. A particularly effective means of adjusting the inductance is illustrated by the insertion of a copper or aluminum ring 114 or an iron slug 116. The ring of copper or aluminum causes a decrease in inductance whereas the iron slug causes and increase in inductance. The mutual inductance between the inductors can be adjusted by changing the gap 118 therebetween. The methods of testing electroacoustic networks described above are particularly suited in combination with these methods of adjustment to quickly reach the frequency and phase response desired. The ring or slug is partially inserted in the inductor and moved until the responses on the spectrum analyzer are as desired with the electroacoustic network under test. Production inductors can then be wound and tested to match the inductance determined by the testing procedure.

I claim:

1. In an electroacoustic loudspeaker having at least a high frequency driver and a low frequency driver mounted co-axially facing in the same direction and energized through a high and low pass dividing filter network and having means for phase compensating the equalizing the acoustic amplitude versus frequency response and acoustic phase versus frequency response.

said electroacoustic high the low pass filter and driver networks each including band pass edges.

said compensating and equalizing means including physical means for reducing acoustic amplitude response varition and acoustic phase response variation as a function of off axis listerer location, said physical means for reducing variations located in front fo at least one of the drivers, and electrical means for reducing acoustic amplitude response variation and acoustic phase response variation as a function of off axis listerer locations, said electrical means for reducing variation in the high and low pass dividing filter network, wherein first, said compensating the equalizing means are selected to substantially flatten the acoustic phase response of the electroacoustic high the low pass filter and driver networks separately both within the substantially beyond the respective band pass edges, second, said compensating and equalizing means are further selected to reduce acoustic amplitude versus frequency response variation and acoustic phase versus frequency response variation of the combined electricacoustic filter and driver networks as a function of off axis angle relative to the axis of the co-axial drivers, third, said compensating and equalizing means are adjusted to substantially flatten the acoustic phase response of the electroacoustic high the low pass filter and driver networks separately both within the substantially beyond the respective band pass edges, and fourth, said compensating and equalizing means are further adjusted to reduce acoustic amplitude versus frequency response variation and acoustic phase versus frequency response variation of the combined electroacoustic filter and driver networks as a function of off axis angle relative to the axis of the to-axial drivers.

2. The electroacoustic loudspeaker of claim 1 wherein the physical means for reducing variation located in front of one of the drivers comprises the size and relative positioning of the high frequency driver and supporting structure in front of the low frequency driver.

3. The electroacoustic loudspeaker of claim 1 wherein the electrical means in the dividing filter network for reducing said variation comprises a resistance and capacitance in series with each other and in parallel with inductance in the low pass filter network.

4. The electroacoustic loudspeaker of claim 1 wherein the electrical means in the dividing filter network for reducing said variation comprises a separate magnetically coupled circuit.

5. The electroacoustic loudspeaker of claim 1 wherein the electrical means in the driving filter network for reducing said variation comprises a delay network in the high pass filter network, said delay network selected and adjusted for phase characteristics being frequency dependent to compensate simultaneously for both the acoustic air path dely defference between the co-axial drivers and the acoustic delay versus frequency characteristics of the high frequency driver.

6. The electroacoustic loudspeaker of claim 1 wherein the electrical means in the dividing filter network for reducing said variation comprises at least one series resonant shunt in the high pass filter network, said shunt selected and adjusted for phase characteristics being frequency dependent to compensate simultaneously for both the acoustic air path delay difference between the co-axial drivers and the acoustic delay versus frequency characteristics of the high frequency driver.

7. The electroacoustic loudspeaker of claim 5 wherein the delay network includes a separate magnetically coupled circuit.

8. The electroacoustic loudspeaker of claim 6 wherein the series resonant shunt includes a separate magnetically coupled circuit.

9. The electroacoustic loudspeaker of claim 1 wherein the physical means for reducing said variation located in front of one of the drivers comprises the size and placement of a sound absorbent material surrounding at least a portion of the high frequency driver.

10. In an electroacoustic loudspeaker having at least a high frequency driver and a low frequency driver mounted non-co-axially and energized through a high and low pass dividing filter network and having means for phase compensating and equalizing the acoustic amplitude versus frequency response and acoustic phase versus frequency response, said electroacoustic high and low pass filter and driver networks each including band pass edges.

said compensating and equalizing means including physical means for reducing acoustic off axis amplitude peaks as a function of off axis listener location, and electrical means for reducing acoustic off axis amplitude peaks as a function of off axis listener location, said electrical means for reducing said peaks in the high and low pass dividing filter network, wherein first, said compensating and equalizing means are selected to substantially flatten the acoustic phase response of the electroacoustic high and low pass filter and driver networks separately both within and substantially beyond the respective band pass edges, second, said compensating and equalizing means are further selected for reducing off axis acoustic amplitude versus frequency response and acoustic phase versus frequency response variation of the combined electroacoustic filter and driver networks as a function of off axis angle relative to the axis of the drivers. axis angle relative to the axis of the drivers, third, said compensatingg and equalized means are adjusted to substantially flatten the acoustic phase response of the electroacoustic high and low pass filter and driver networks separately both within and substantially beyond the respective band pass edges, and fourth, said compensating and equalizing means are further adjusted for reducing off axis acoustic amplitude versus frequency response and acoustic phase versus frequency response variation of the combined electroacoustic filter and driver networks as a function of off axis angle relative to the axis of the drivers.

11. The electroacoustic loudspeaker of claim 10 wherein the physical means for reducing undesirable peaks comprises the relative positioning and size of the high frequency driver with respect to the low frequency driver.

12. The electroacoustic loudspeaker of claim 10 wherein the electrical means for reducing undesirable peaks comprises a resistance and capacitance in series with each other and in parallel with inductance in the low pass filter network.

13. The electroacoustic loudspeaker of claim 10 wherein the electrical means for reducing peaks comprises a separate magnetically coupled circuit in the dividing filter network.

14. The electroacoustic loudspeaker of claim 10 wherein the electrical means for reducing said peaks comprises a delay network in the high pass filter network of the dividing filter network, said delay network selected and adjustedfor phase characteristics being frequency dependent to compensate simultaneously forboth the acoustic air path delay difference between the drivers and the acoustic delay versus frequency characteristics of the high frequency driver.

15. The electroacoustic loudspeaker of claim 10 wherein the electrical means for reducing said peaks comprises at least one series resonant shunt in the high pass filter network of the dividing filter network, said shunt selected and adjusted for phase characteristics being frequency dependent to compensate simultaneously for both the acoustic air path delay difference between the drivers and the acoustic delay versus frequency characteristics of the high frequency driver.

16. The electroacoustic loudspeaker of claim 14 wherein the delay network includes a separate magnetically coupled circuit.

17. The electroacoustic loudspeaker of claim 15 wherein the series resonant shunt includes a separate magnetically coupled circuit.

* * * * *

UNITED STATES PATENT AND TRADEMARK OFFICE
CERTIFICATE OF CORRECTION

PATENT NO. : 4,769,848

DATED : September 6, 1988

INVENTOR(S) : Steven J. Eberbach

It is certified that error appears in the above-identified patent and that said Letters Patent is hereby corrected as shown below:

Column 7, line 4: Insert --and 82-- after "80".

Column 8, line 40: Delete "and in the delay line" after "line".

Column 9, line 54: Delete "and" and substitute --an--.

Column 10, line 3: Delete "the" and substitute --and--.

line 6: Delete "the" and substitute --and--.

line 10: Delete "varition" and substitute --variation--.

line 11: Delete "listerer" and substitute --listener--.

line 13: Delete "fo" and substitute --of--.

line 16: Delete "listerer" and substitute --listener--.

line 16: Delete "locations" and substitute --location--.

line 19: Delete "the" and substitute --and--.

line 21: Delete "the" and substitute --and--.

line 23: Delete "the" and substitute --and--.

line 30: Delete "electriacoustic and substitute --electroacoustic--.

line 35: Delete "the" and substitute --and--.

line 37: Delete "the" and substitute --and--.

line 45: Delete "to-axial" and substitute --co-axial--.

UNITED STATES PATENT AND TRADEMARK OFFICE
CERTIFICATE OF CORRECTION

PATENT NO. : 4,769,848
DATED : September 6, 1988
INVENTOR(S) : ELECTROACOUSTIC NETWORK It is certified that error appears in the above-identified patent and that said Letters Patent is hereby corrected as shown below:

Continuation sheet no. 2:

Column 10, line 62: Delete "driving" and substitute --dividing--.

Column 10, line 67: Delete "dely defference" and substitute --delay difference--.

Column 12, line 1: Delete "axis angle relative to the axis of the drivers"
         & line 2: after "drivers".

Column 12, line 3: Delete "compensatingg" and substitute --compensating--.

line 3: Delete "equalized" and substitute --equalizing--.

Column 12, line 34: Space between "adjusted" and "for".

line 36: Space between "for" and "both".

Signed and Sealed this

First Day of August, 1989

Attest:

DONALD J. QUIGG

Attesting Officer      Commissioner of Patents and Trademarks